United States Patent
Lee et al.

(10) Patent No.: US 10,273,162 B2
(45) Date of Patent: Apr. 30, 2019

(54) COATING METHOD OF CALCIUM CARBONATE FILM

(71) Applicant: KOREA INSTITUTE OF GEOSCIENCE AND MINERAL RESOURCES, Daejeon (KR)

(72) Inventors: Seung-Woo Lee, Daejeon (KR); Soo-Chun Chae, Seoul (KR); Chi-Wan Jeon, Daejeon (KR)

(73) Assignee: KOREA INSTITUTE OF GEOSCIENCE AND MINERAL RESOURCES, Daejeon (KR)

( * ) Notice: Subject to any disclaimer, the term of this patent is extended or adjusted under 35 U.S.C. 154(b) by 371 days.

(21) Appl. No.: 14/925,637

(22) Filed: Oct. 28, 2015

(65) Prior Publication Data
US 2016/0280559 A1 Sep. 29, 2016

(30) Foreign Application Priority Data
Mar. 25, 2015 (KR) ........................ 10-2015-0041536

(51) Int. Cl.
*C01F 11/18* (2006.01)
*B32B 9/00* (2006.01)

(52) U.S. Cl.
CPC ............ *C01F 11/181* (2013.01); *B32B 9/005* (2013.01)

(58) Field of Classification Search
CPC .................................................. C01F 11/181
See application file for complete search history.

(56) References Cited

U.S. PATENT DOCUMENTS

| 2010/0048791 A1* | 2/2010 | Vucak ...................... C01F 11/18 524/425 |
| 2010/0221362 A1* | 9/2010 | Bentov .................. A61K 31/66 424/687 |
| 2010/0258506 A1* | 10/2010 | Berkowitz ............ C01F 11/181 210/713 |

FOREIGN PATENT DOCUMENTS

| JP | 2003-238151 A | 8/2003 |
| KR | 101065118 B1 | 9/2011 |
| KR | 20110104215 A | 9/2011 |
| KR | 10-1453923 | 10/2014 |

OTHER PUBLICATIONS

Xu et al. Two Modes of Transformation of Amorphous Calcium Carbonate Films in Air. J. Phys. Chem. B, vol. 110, No. 6, 2006. (Year: 2006).*
Xu et al. Formation of Amorphous Calcium Carbonate Thin Films and Their Role in Biomineralization. Chem. Mater. 2004, 16, 1740-1746. (Year: 2004).*
Korean Notice of Allowance with English Translation for Application No. 10-2015-0041536, dated Jun. 28, 2017, 4 pages.
Korea Office action dated Jul. 13, 2016 for Korea Application No. KR 10-2015-0041536, 10 pages.

* cited by examiner

*Primary Examiner* — Michael M Dollinger
(74) *Attorney, Agent, or Firm* — Lewis Roca Rothgerber Christie LLP

(57) ABSTRACT

A method of coating a calcium carbonate film. In one aspect, the method includes preparing a calcium aqueous solution by adding a calcium-containing material to distilled water; forming a calcium carbonate film on a surface of the calcium aqueous solution by leaving the calcium aqueous solution; placing the calcium carbonate film on a substrate; and forming a calcium carbonate coating film by leaving the calcium carbonate film on the substrate.

9 Claims, 3 Drawing Sheets

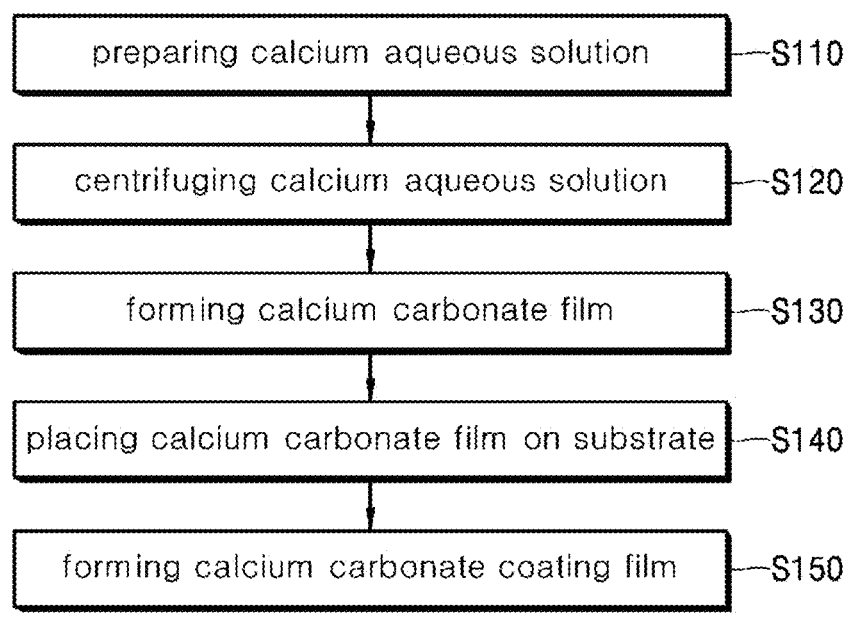
[Fig. 1]

[Fig. 2]
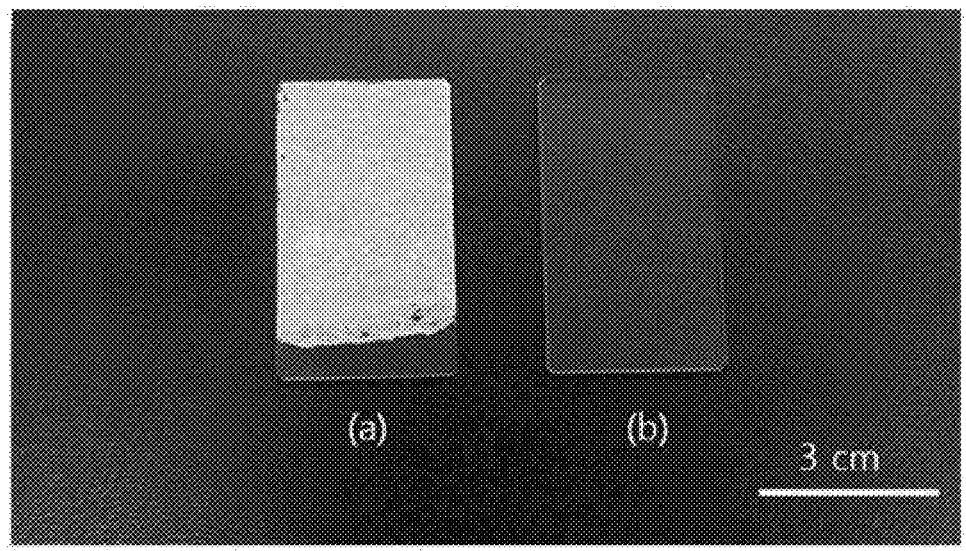

[Fig. 3]
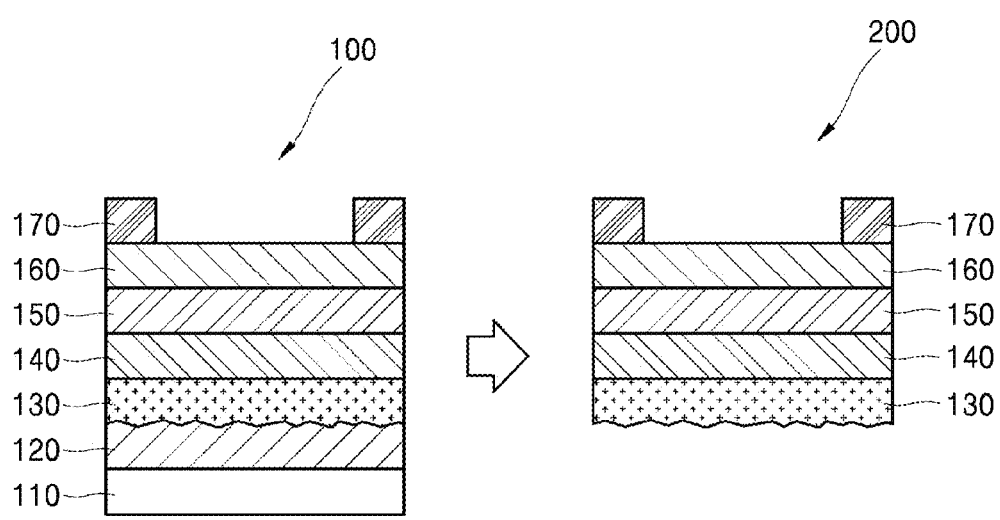

COATING METHOD OF CALCIUM CARBONATE FILM

CROSS-REFERENCE TO RELATED APPLICATION

This application claims priority to Korean Patent Application No. 10-2015-0041536 filed on Mar. 25, 2015, and all the benefits accruing therefrom under 35 U.S.C. § 119, the contents of which is incorporated by reference in its entirety.

BACKGROUND OF THE INVENTION

1. Field of the Invention

The present invention relates generally to a coating method of a calcium carbonate film.

2. Description of the Related Art

Calcium carbonate ($CaCO_3$) is one of common minerals existing on the earth and is a representative material that can be synthesized at the lower temperature. In particular, the calcium carbonate can be synthesized not only on the earth, but also in the sea. The calcium carbonate synthesized from living things existing in the sea (for instance, a clam shell or a sea urchin string) is more suitable to a living body when compared to other calcium carbonate and represents superior material characteristics. The calcium carbonate synthesized in the sea is crystallized under the sea water condition such as the normal temperature and the normal pressure and represents superior shape characteristic, so the calcium carbonate is expected to be applied to high value added industries, such as the industries for bio sensors and tissue engineering, in addition to stuff and material industries.

The calcium carbonate is a material subject to the phase transition in the initial synthesis process and is classified into amorphous phase calcium carbonate and crystal phase calcium carbonate in which the crystal phase calcium carbonate is divided into hydrous calcium carbonate ($CaCO_3 \cdot 6H_2O$, $CaCO_3 \cdot H_2O$, etc.) and anhydrous calcium carbonate (vaterite, aragonite, and calcite). The chemical property of the calcium carbonate may vary depending on the property of the crystal phase. For example, solubility of $CaCO_3 \cdot H_2O$ is ten times higher than that of calcite, and Mohs hardness of calcite is 3, but Mohs hardness of aragonite is about 4 to 4.5. Therefore, the chemical property may vary even if materials have the same crystal phase, so the difference in the chemical property between the amorphous phase and the crystal phase may become severe.

If a thin film having a large area is formed by using the calcium carbonate, the thin film may be applicable for the high value added industries, such as for bio sensors and bio materials. However, complex processes and high cost are necessary to form the thin film and it is difficult to form the thin film having the large area.

As related arts, there is Korean Patent Registration No. 10-1453923 (issued on Oct. 24, 2014) entitled "manufacturing of calcium carbonate films having aragonite structure by electrochemical process".

SUMMARY OF THE INVENTION

Accordingly, the present invention provides a method of coating a calcium carbonate film on a substrate using amorphous adsorptive power without adhesive by adjusting time, concentration, reaction temperature and pressure conditions during the phase transition of the calcium carbonate film from the amorphous phase to the crystal phase through a simple and inexpensive scheme.

The objects of the present invention are not limited to the above-mentioned objects, and other objects will be clearly understood from the following description by those skilled in the art.

To achieve the above object, the present invention provides a method of coating a calcium carbonate film, which includes preparing a calcium aqueous solution by adding a calcium-containing material to distilled water; forming a calcium carbonate film on a surface of the calcium aqueous solution by leaving the calcium aqueous solution; placing the calcium carbonate film on a substrate; and forming a calcium carbonate coating film by leaving the calcium carbonate film on the substrate.

The method may further include obtaining a liquid phase by centrifuging the calcium aqueous solution after preparing the calcium aqueous solution and the calcium carbonate film may be formed by separating the liquid phase.

A content of the calcium-containing material in the distilled water may be in a range of 1 g to 500 g based on 1 L of the distilled water.

The forming of the calcium carbonate film may be performed in a temperature range of 0 to 95° C. and a pressure range of 0.1 atm to 2 atm.

The placing of the calcium carbonate film on the substrate may be performed when 10 seconds to 24 hours have elapsed from formation of the calcium carbonate film on the surface of the calcium aqueous solution.

The placing of the calcium carbonate film on the substrate may be performed when 10 seconds to 48 hours have elapsed from addition of the calcium-containing material to the distilled water.

The calcium carbonate film may have crystallinity in a range of 5% to less than 60%.

The calcium carbonate film may be an amorphous phase and the calcium carbonate coating film may be a crystal phase.

The forming of the calcium carbonate coating film may be performed for 30 minutes to 144 hours.

The forming of the calcium carbonate coating film may be performed in a temperature range of 0 to 200° C.

The calcium carbonate coating film may have crystallinity in a range of 60% to 99%.

The calcium-containing material may be at least one selected from the group consisting of a shell, a heat-treated shell, $CaCl_2$, $CaSO_4$, $Ca(HCO_3)_2$, $CaO$, $CaSiO_3$ and $Ca(OH)_2$.

The substrate may include at least one selected from the group consisting of glass, aluminum foil, plastic, quartz, Au, Li, Mg, Sr, Ba, Zn, Ag, Si, Ge, GaAs, InP, $Al_2O_3$, SiC, MgO, InSb, InAs, AlAs, AlSb, CdTe, ZnTe, ZnS, CdSe, CdSb, GaP, polydimethylsiloxane (PDMS), polyethyleneterephthalate (PET), polystyrene (PS), polyimide (PI), polyvinyl chloride (PVC), polyvinyl pyrrolidone (PVP), polypropylene (PP), polyurethane (PU) and polyethylene (PE).

The substrate having the calcium carbonate coating film may be an adhesive-free substrate.

In addition, the present invention provides a calcium carbonate-coated substrate including a substrate; and a calcium carbonate coating film formed on the substrate, wherein the calcium carbonate coating film has crystallinity in a range of 60% to 99%.

The calcium carbonate-coated substrate may be an adhesive-free substrate.

The calcium carbonate coating film may have a thickness in a range of 0.01 μm to 100 μm.

According to the present invention, the calcium carbonate film is placed on the substrate after a predetermined time has elapsed from the formation of the calcium carbonate film and the calcium carbonate film remains on the substrate for a predetermined time to form the calcium carbonate coating film. Since the calcium carbonate film is uniformly grown from the substrate, the calcium carbonate film, which is unstable in terms of thermodynamics, can be uniformly bonded onto the substrate without additional adhesive when forming the calcium carbonate coating film. In addition, the calcium carbonate film can be rapidly formed at a low cost through a simple device and a simple method. Further, since the coating layer has a concavo-convex shape, the surface area may be enlarged, so that the reactivity can be improved and the solar light reflection can be prevented.

BRIEF DESCRIPTION OF THE DRAWINGS

FIG. 1 is a flowchart showing a coating method of a calcium carbonate film according to one embodiment of the present invention.

FIG. 2 is a photographic view showing calcium carbonate (a) coated on a glass substrate (b) according to one embodiment of the present invention.

FIG. 3 is a schematic view showing a method of manufacturing a thin film solar cell using a substrate coated with a calcium carbonate film according to one embodiment of the present invention.

DETAILED DESCRIPTION OF THE INVENTION

Hereinafter, exemplary embodiments of the present invention will be described with reference to accompanying drawings. In the following description, if detailed description about well-known functions or configurations may make the subject matter of the disclosure unclear, the detailed description will be omitted. In addition, terminologies to be described herein are defined based on functions of components according to the embodiment of the present invention, and may have meanings varying according to the intentions of a user or an operator and the custom in the field of art. Accordingly, the terminologies should be defined based on the whole context throughout the present specification. The same reference numerals may be used to refer to the same elements.

In the following description, when a predetermined part "includes" a predetermined component, the predetermined part does not exclude other components, but may further include other components unless otherwise indicated.

Hereinafter, a method of coating a calcium carbonate film through underwater growth according to embodiments of the present invention will be described with reference to accompanying drawings. However, the present invention will not be limited to the embodiments and drawings.

According to the first aspect of the present invention, there is provided a method of coating a calcium carbonate film, which includes preparing a calcium aqueous solution by adding a calcium-containing material to distilled water; forming a calcium carbonate film on a surface of the calcium aqueous solution by leaving the calcium aqueous solution; placing the calcium carbonate film on a substrate; and forming a calcium carbonate coating film by leaving the calcium carbonate film on the substrate.

When forming the calcium carbonate film, the calcium carbonate film may be directly prepared by adding the calcium-containing material to the distilled water or may be prepared by separating a liquid phase which is obtained by centrifuging the calcium aqueous solution obtained by adding the calcium to the distilled water.

According to the method of coating the calcium carbonate film of the present invention, the calcium carbonate film is placed on the substrate when a predetermined time has elapsed after the calcium carbonate film is formed on the surface of the distilled water by adding the calcium-containing material to the distilled water. Then, the calcium carbonate coating film is formed by leaving the calcium carbonate film placed on the substrate for a predetermined time. Thus, the calcium carbonate may be uniformly grown so that the calcium carbonate coating film may be uniformly bonded to the substrate without using an additional adhesive. In particular, the shape characteristics for the surface of the final calcium carbonate coating film may be adjusted suitably for the requirements of the target application by adjusting the dwell time of the calcium carbonate film in the aqueous solution, the dwell time of the calcium carbonate film on the substrate and the type and concentration of additives of the aqueous solution.

FIG. 1 is a flowchart showing a coating method of a calcium carbonate film according to one embodiment of the present invention.

Referring to FIG. 1, the coating method of the calcium carbonate film according to one embodiment of the present invention may include steps of preparing a calcium aqueous solution S110, centrifuging the calcium aqueous solution S120, forming a calcium carbonate film S130, placing the calcium carbonate film on a substrate S140, and forming a calcium carbonate coating film S150. In particular, although the calcium carbonate coating film can be formed without the centrifuging step, the centrifuging step may facilitate the formation of a crystal nucleus on the substrate by separating slurry, which is generated when the calcium carbonate film is formed, and may prevent deterioration in formation of the crystal nucleus caused by calcium remaining in the solution.

In the calcium aqueous solution forming step S110, the calcium is added to and dissolved in the distilled water. For instance, the calcium aqueous solution may include water and distilled water as a solvent, and the content of the calcium-containing material in the distilled water may be in the range of 1 g to 500 g based on 1 L of the distilled water. If the content of the calcium-containing material is less than 1 g based on 1 L of the distilled water, the calcium carbonate film may not be formed. In contrast, if the content of the calcium-containing material exceeds 500 g based on 1 L of the distilled water, the calcium carbonate may not form a film and an excessive amount of calcium may be precipitated.

The calcium carbonate film may be formed in the temperature range of 0 to 95° C. and the pressure range of 0.1 atm to 2 atm. If the temperature and pressure are out of the above range, the calcium carbonate film may not be formed and the coating film may not be formed since the calcium carbonate cannot be bonded to the substrate in the subsequent process.

For example, the calcium-containing material may be at least one selected from the group consisting of a shell, a heat-treated shell, $CaCl_2$, $CaSO_4$, $Ca(HCO_3)_2$, $CaO$, $CaSiO_3$ and $Ca(OH)_2$. The heat-treated shell may be obtained by heat treating the shell for 1 hour to 72 hours at the temperature of 600° C. to 700° C.

In the calcium aqueous solution centrifuging step S120, the liquid may be obtained by separating the aqueous solution containing the calcium into the solid phase and the liquid phase at 100 rpm to 10,000 rpm of a centrifugal separator.

In the calcium carbonate film forming step S130, the calcium carbonate film may be formed on the surface of the aqueous solution by separating the centrifuged aqueous solution or by directly applying the aqueous solution.

For example, the calcium carbonate film can be obtained by leaving the centrifuged aqueous solution at the temperature of 3° C. to 35° C. and the pressure of 0.5 atm to 2 atm for 5 minutes to 30 days. For instance, the centrifuged aqueous solution may be left at the normal temperature and normal pressure for 10 minutes to 30 days.

The calcium carbonate film obtained through the above process may have crystallinity in the range of 5% to less than 60%.

In the step S140 of placing the calcium carbonate film on the substrate, the calcium carbonate film formed on the surface of the aqueous solution may be placed on the substrate used for electronic devices, etc.

The substrate may be at least one selected from the group consisting of glass, aluminum foil, plastic, quartz, Au, Li, Mg, Sr, Ba, Zn, Ag, Si, Ge, GaAs, InP, Al2O3, SiC, MgO, InSb, InAs, AlAs, AlSb, CdTe, ZnTe, ZnS, CdSe, CdSb, GaP, polydimethylsiloxane (PDMS), polyethyleneterephthalate (PET), polystyrene (PS), polyimide (PI), polyvinyl chloride (PVC), polyvinyl pyrrolidone (PVP), polypropylene (PP), polyurethane (PU) and polyethylene (PE).

According to the mechanism for forming the calcium carbonate film according to one embodiment of the present invention, calcium carbonate components are naturally floated on the surface of the aqueous solution due to the calcium so that an amorphous phase having a hemispheric shape is initially formed at a boundary between an atmospheric layer and an aqueous solution layer. Then, as time goes by, formation of the calcium carbonate film is induced through the self-aggregation between the hemispheric calcium carbonate components. Crystals having blade shapes are grown from the surface of the calcium carbonate components. In the initial stage, the calcium carbonate film is synthesized through the self-aggregation of the amorphous calcium carbonate and then the secondary crystallization is progressed mainly by calcite as reaction retention time increases.

The step of placing the calcium carbonate film on the substrate may be performed after 10 seconds to 24 hours have elapsed from the formation of the calcium carbonate film. If the calcium carbonate film is placed on the substrate before 10 seconds have elapsed, the calcium carbonate coating film may not be formed. In addition, if more than 24 hours elapse from the formation of the calcium carbonate film, the crystal phase of the calcium carbonate film is determined, so the amorphous phase has weak adsorptive power, so that the calcium carbonate film may not be readily bonded to the substrate.

The step of placing the calcium carbonate film on the substrate may be performed after 10 seconds to 48 hours have elapsed from the point where the calcium is added to and dissolved in the aqueous solution having additives dissolved therein.

In the step S150 of forming the calcium carbonate coating film, the calcium carbonate coating film is formed by leaving the calcium carbonate film on the substrate.

The calcium carbonate film may be an amorphous phase and the calcium carbonate coating film may be a crystal phase.

As the dwell time of the calcium carbonate film on the substrate has elapsed, the growth of the calcite, which is a crystalloid having relatively great concentration, is induced through the phase transition from the amorphous phase to the crystal phase. The method of forming the calcium carbonate coating film according to one embodiment of the present invention may be progressed through the following reaction mechanism. The phase transition to the crystal phase (calcite) is performed after the synthesis of the amorphous calcium carbonate and $CaCO_3 \cdot H_2O$.

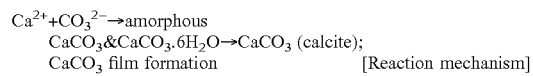

According to the step of forming the calcium carbonate coating film, the calcium carbonate film is left on the substrate for 30 minutes to 144 hours so that the calcium carbonate film is uniformly grown into a crystal phase (calcite) as times go by, so the calcium carbonate film may represent strong adhesive force with respect to the substrate. Meanwhile, depending on the conditions, the coating film may be formed in advance of the above time if the crystallization is sufficiently achieved.

In the step of forming the calcium carbonate coating film, the calcium carbonate film placed on the substrate may be left at the temperature range of 0 to 95° C., preferably 10° C. to 30° C., and the pressure range of 0.1 atm to 2 atm, preferably 0.5 atm to 1.5 atm.

The step of forming the calcium carbonate coating film may further include a step of drying the calcium carbonate film at the temperature of 0° C. to 200° C. for 10 seconds to 48 hours (not shown). If the temperature is less than 0° C., the calcium carbonate may not be bonded to the substrate so that the coating layer may not be formed. If the temperature exceeds 200° C., the crystallization may be rapidly progressed, so the calcium carbonate may not be bonded to the substrate, so that the coating layer may not be formed.

The substrate formed with the calcium carbonate coating film may be an adhesive-free substrate. After the calcium carbonate film is formed, the calcium carbonate film is centrifuged. Then, after 10 seconds to 24 hours have elapsed, the calcium carbonate film is placed on the substrate and left for a predetermined time on the substrate to form the calcium carbonate coating film. Thus, the crystal can be uniformly grown on the substrate, so that the calcium carbonate coating film evenly attached onto the substrate can be formed. Therefore, the calcium carbonate film, which is unstable in terms of thermodynamics, can be uniformly bonded onto the substrate without additional adhesive due to the uniform crystal growth of the calcium carbonate so that the calcium carbonate film, which is unstable in terms of thermodynamics, can be uniformly bonded onto the substrate without additional adhesive, thereby forming the calcium carbonate coating film.

The calcium carbonate coating film may have crystallinity in the range of 60% to 99%.

As a result, the calcium carbonate coating film can be formed on the substrate without using additional adhesive.

According to the second aspect of the present invention, there is provided a calcium carbonate-coated substrate including a substrate; and a calcium carbonate coating film formed on the substrate, wherein the calcium carbonate coating film has crystallinity in a range of 60% to 99%.

The calcium carbonate-coated substrate may be an adhesive-free substrate.

According to the calcium carbonate-coated substrate of the present invention, the calcium carbonate coating layer can be uniformly attached onto the substrate without using adhesive by adjusting the dwell time of the calcium carbonate film in the aqueous solution and the dwell time of the calcium carbonate film on the substrate.

The calcium carbonate coating film may have a thickness in the range of 0.01 μm to 100 μm. The calcium carbonate coating film may be applicable to various material industries using a silicon wafer, a metal film and a polymer film. In addition, the long-period experimental observation may be possible against the calcium carbonate coating film, so that the calcium carbonate coating film may promote the study on the bio-mineralization and the carbonation process performed for $CO_2$ underground storage.

According to the third aspect of the present invention, there is provided a method of forming a concavo-convex shaped coating layer, which includes forming a coating layer of various materials on a calcium carbonate coating film formed on a substrate to form the concavo-convex shaped coating layer in a direction reverse to a direction of a concavo-convex shaped calcium carbonate coating film, and removing the calcium carbonate coating film.

FIG. 3 is a schematic view showing a method of manufacturing a thin film solar cell using a substrate coated with a calcium carbonate film according to one embodiment of the present invention, which is an example of applying the method of forming the concavo-convex shaped coating layer to the manufacture of the thin film solar cell.

Referring to FIG. 3, a concavo-convex shaped calcium carbonate layer 120 is formed on a glass substrate 110, and, due to the concavo-convex shaped calcium carbonate layer 120, a Mo back electrode layer 130 formed on the concavo-convex shaped calcium carbonate layer 120 may have a concavo-convex pattern in a direction reverse to a concavo-convex pattern of the calcium carbonate layer 120. A CIGS light absorbing layer 140 is formed on the Mo back electrode layer 130, a CdS buffer layer 150 is formed on the CIGS light absorbing layer 140, a ZnO window electrode layer 160 is formed on the CdS buffer layer 150, and an upper electrode layer 170 is formed on the ZnO window electrode layer 160, thereby forming a thin film solar cell 100. The thin film solar cell 100 is immersed in an organic solvent, such as ethanol, to dissolve the concavo-convex shaped calcium carbonate layer 120, so that a thin film solar cell 200, in which a concavo-convex pattern is formed on the Mo back electrode layer 130, can be manufactured.

Hereinafter, embodiments of the prevention will be described in more detail. The following embodiments are illustrative purposes only, and they are not intended to limit the scope of the present invention.

Embodiment 1

First, 50 g of $Ca(OH)_2$ and 1 L of distilled water were put into a beaker having a volume of 2 L and mixed at 500 RPM for 1 minute. The aqueous solution mixed with $Ca(OH)_2$ was separated into a solid phase a liquid phase by using a centrifugal separator having 1,000 RPM for 1 minute. The separated liquid phase solution was put into a schale having a volume of 500 ml and left for 10 minutes. Then, $Ca(OH)_2$ particles (amorphous phase) formed on a surface layer between an atmosphere and water were taken out by using the glass substrate and then dried in the atmosphere for 24 hours.

FIG. 2 is a photographic view showing calcium carbonate (a) coated on a glass substrate (b) according to one embodiment of the present invention. Referring to FIG. 2, after the drying process, the calcium carbonate is coated on the glass substrate and securely fixed to the glass substrate, thereby forming the coating film.

Embodiment 2

Molybdenum was deposited through DC sputtering onto calcium carbonate coated on a glass substrate manufactured according to embodiment 1 and the heat treatment was performed at the temperature of 400° C. to prevent the counter diffusion with respect to a CIGS layer. At this time, due to the concavo-convex shaped calcium carbonate layer, a Mo layer formed on a calcium carbonate layer was formed with a concavo-convex pattern reverse to a concavo-convex pattern of the calcium carbonate layer. After the heat treatment process, a compound including Cu, In, Ga and Se were deposited on the Mo layer, thereby forming the CIGS layer. In this case, the CIGS layer can be formed through the co-evaporation process, which can simultaneously evaporate unit elements of Cu, In, Ga and Se or through the sputtering process, which unifies Cu, In, Ga and Se into a single target and generates plasma to deposit the single target. A paste including CdS, an organic solvent, a binder and a flux was coated on the CIGS layer and the heat treatment process was performed with respect to the paste to form the CdS layer and a ZnO layer was formed on the CdS layer through the sputtering process. An Al layer was formed on the ZnO layer through the photolithography process such that the Al layer has a minimum area and a minimum line width to improve the incident efficiency of solar light. Finally, the manufactured thin film solar cell was immersed in ethanol so that the calcium carbonate was dissolved and the glass substrate coated with the calcium carbonate was removed. In the manufactured thin film solar cell, a concavo-convex pattern was formed in the Mo layer serving as a back electrode, so the reflection of incident light was diminished so that the performance of the solar cell was improved.

What is claimed is:

1. A method of coating a calcium carbonate film, the method comprising:
   preparing a calcium aqueous solution by adding $Ca(OH)_2$ to distilled water;
   obtaining a liquid phase by centrifuging the calcium aqueous solution at 1,000 RPM for 1 minute after preparing the calcium aqueous solution;
   forming a calcium carbonate film on a surface of the calcium aqueous solution by leaving the calcium aqueous solution;
   placing the calcium carbonate film on a substrate; and
   forming a calcium carbonate coating film by leaving the calcium carbonate film on the substrate,
   wherein content of the calcium in the distilled water is in a range of 1 g to 500 g based on 1l of the distilled water,
   the forming of the calcium carbonate film is performed in a temperature range of 0 to 95° C. and a pressure range of 0.1 atm to 2 atm,
   the placing of the calcium carbonate film on the substrate is performed when 10 seconds to 10 minutes have elapsed from formation of the calcium carbonate film on the surface of the calcium aqueous solution for using an adsorptive power of an amorphous phase of the calcium carbonate film.

2. The method of claim 1, wherein the calcium carbonate film has crystallinity in a range of 5% to less than 60%.

3. The method of claim 1, wherein the placing of the calcium carbonate film on the substrate is performed when 10 seconds to 48 hours have elapsed from addition of the calcium to the distilled water.

4. The method of claim 1, wherein the calcium carbonate film has an amorphous phase and the calcium carbonate coating film has a crystal phase.

5. The method of claim 1, wherein the forming of the calcium carbonate coating film is performed for 30 minutes to 144 hours.

6. The method of claim 1, wherein the forming of the calcium carbonate coating film is performed in a temperature range of 0 to 200° C.

7. The method of claim 1, wherein the calcium carbonate coating film has crystallinity in a range of 60% to 99%.

8. The method of claim 1, wherein the substrate includes one selected from the group consisting of glass, aluminum foil, plastic, quartz, Au, Li, Mg, Sr, Ba, Zn, Ag, Si, Ge, GaAs, InP, $Al_2O_3$, SiC, MgO, InSb, InAs, AlAs, AlSb, CdTe, ZnTe, ZnS, CdSe, CdSb, GaP, polydimethylsiloxane (PDMS), polyethyleneterephthalate (PET), polystyrene (PS), polyimide (PI), polyvinylchloride (PVC), polyvinylpyrrolidone (PVP), polypropylene (PP), polyurethane (PU) and polyethylene (PE).

9. The method of claim 1, wherein the substrate having the calcium carbonate coating film is an adhesive-free substrate.

* * * * *